United States Patent [19]
Allocca et al.

[11] Patent Number: 6,121,911
[45] Date of Patent: Sep. 19, 2000

[54] DATA GATHERING CIRCUIT HAVING REDUCED POWER CONSUMPTION

[75] Inventors: David Allocca, Lexington Park; Vincent M. Contarino, Solomons, both of Md.

[73] Assignee: The United States of America as represented by the Secretary of the Navy, Washington, D.C.

[21] Appl. No.: 09/157,353

[22] Filed: Aug. 19, 1998

[51] Int. Cl.[7] ................................................. H03M 1/12
[52] U.S. Cl. ............................................. 341/155; 363/95
[58] Field of Search .............................. 341/155; 363/41; 323/283, 282

[56] References Cited

U.S. PATENT DOCUMENTS 5,594,631  1/1997  Katoozi et al. ........................... 363/41

*Primary Examiner*—Peguy JeanPierre
*Attorney, Agent, or Firm*—Ron Billi

[57] ABSTRACT

A system for conserving power and reducing heat generation, and a method of operation thereof, that turns off an analog-to-digital converter during the period of time of non-data acquisition is disclosed.

7 Claims, 2 Drawing Sheets

DATA GATHERING CIRCUIT HAVING REDUCED POWER CONSUMPTION

BACKGROUND OF THE INVENTION

1.0 Field of the Invention

The invention relates to a system, and a method of operation thereof, for reducing the power consumption of a circuit for data gathering and, more particularly, to a system, and a method of operation thereof, for conserving power and reducing heat generation of an analog-to-digital converter.

2.0 Description of Related Art

Data gathering circuits, such as analog-to-digital converters, find numerous applications for the conversion of an analog quantity into digital units, such as binary bits, for usage in digital computer processing. The analog-to-digital converters operate in a continuous wave (CW) fashion, which means that the analog-to-digital converter is always in the "on" condition in a system; even when the system employing the analog-to-digital converter is in a quiescent state and not processing data.

Analog-to-digital converters, even though of miniature dimensions, operated in a continuous wave (CW) fashion typically consume about 6 watts of energy and run at a temperature of approximately 70° C. Considering the multiplicity of analog-to-digital converters in a typical application, such continuous operation can represent a sufficient power consumption. More particularly, these 6 watts and 70° C. factors lead to relatively large amounts of unwanted power consumption and heat load, some of which serves no use for work, but rather places severe operating constraints on the system employing the analog-to-digital converters. It is desired that means be provided for reducing both the power consumption and the heat load of data gathering circuits, in particular, analog-to-digital converters so as to ease the constraints of providing sufficient electrically power and cooling of the analog-to-digital converters.

OBJECTS OF THE INVENTION

It is a primary object of the present invention to provide a system for reducing the power consumption and heat load of data gathering circuits, in particular, analog-to-digital converters.

It is a further object of the present invention to provide for a system, and a method of operation thereof, that only operates the analog-to-digital converter when the need for data gathering is present.

It is another object of the present invention to provide for a system that operates the analog-to-digital converter in a pulse mode.

Further still, it is an object of the present invention to provide means so that the analog-to-digital converter is operated in the pulse mode and allows sufficient time for the correct digital reproduction by the analog-to-digital converter of its analog input.

Furthermore, it is an object of the present invention to provide for the operation of an analog-to-digital converter that reduces the power consumption and heat load thereof by a factor of 1000, as compared to the conventional operation of analog-to-digital converters.

SUMMARY OF THE INVENTION

The invention is directed to a system, and a method of operation thereof, that reduces power consumption as well as heat generation, while at the same time maintains the proper operation of a data gathering circuit, such as an analog-to-digital converter.

The system operates the analog-to-digital converter in a non-continuous manner and renders operable the analog-to-digital converter upon the application of excitation from a power supply. The analog-to-digital converter is responsive to the simultaneous occurrence of input signals representing data and a clock signal. The input signals are in the form of pulses separated by a first predetermined duration. The system comprises a controllable switch responsive to a control signal having a second predetermined duration which is less than the first predetermined duration. The controllable switch is interposed between the analog-to-digital converter and the power supply and provides for the application of the excitation to the analog-to-digital converter in response to the control signal, thereby, causing the analog-to-digital converter to provide digital output signals representative of its received analog input.

DETAILED DESCRIPTION OF THE PREFERRED EMBODIMENTS

Figure 1:
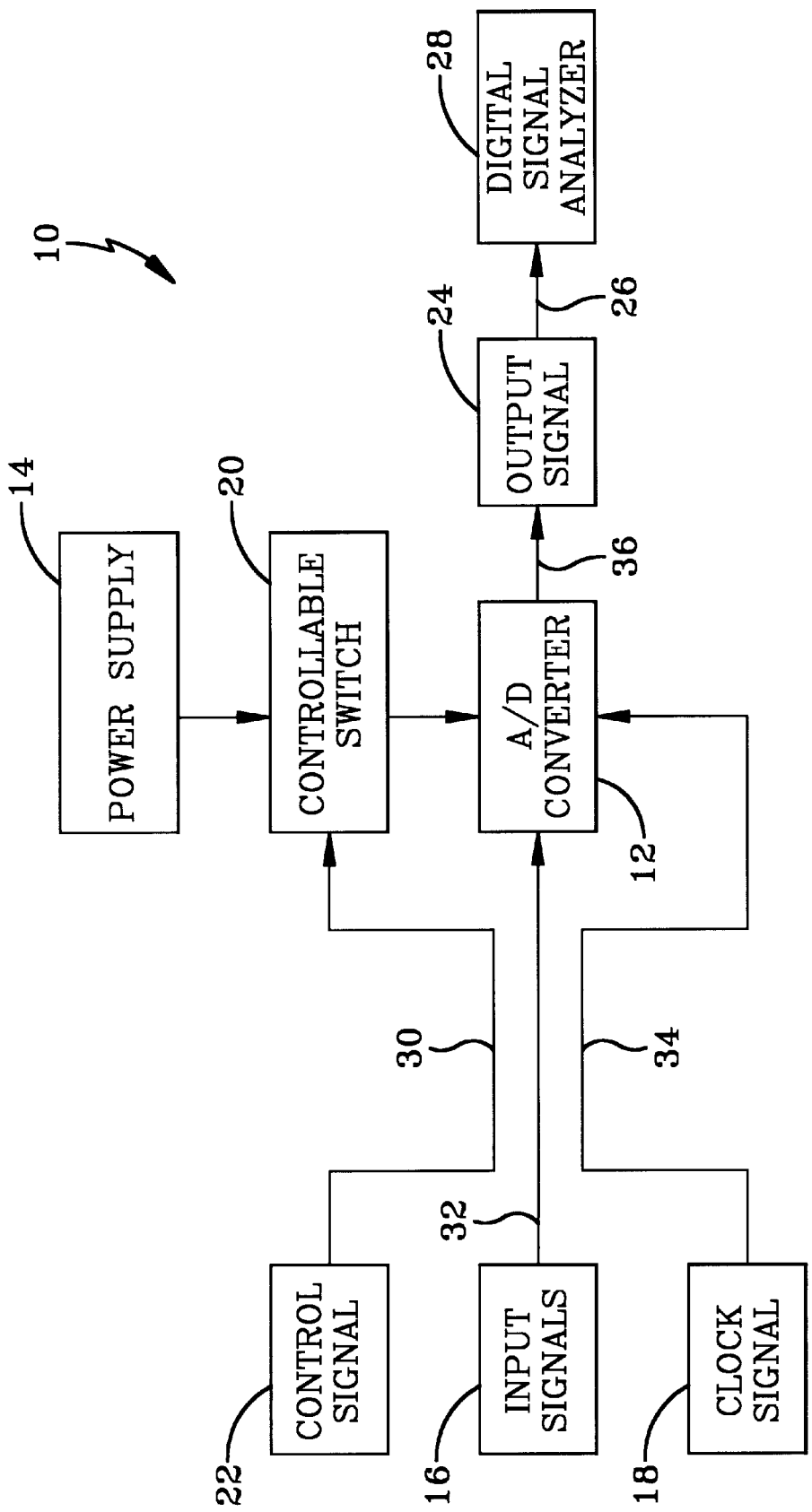
FIG. 1 is a block diagram of the system of the present invention.

With reference to the drawing, wherein the same reference number indicates the same element throughout, there is shown in FIG. 1 a block diagram of a system 10 that reduces the power consumption and heat load of data gathering circuits, in particular, analog-to-digital converters.

The system 10 is particularly suited to accommodate a circuit used for data gathering, such as an analog-to-digital converter 12, and operates the analog-to-digital converter 12 in a non-continuous manner and renders the analog-to-digital converter 12 operable upon the application of excitation from a power supply 14. The analog-to-digital converter 12 is responsive to the simultaneous occurrence of input signals 16, representative of data, and a clock signal 18. The input signals 16 are preferably in the form of pulses separated by a first predetermined duration.

The system 10 comprises a controllable switch 20 which is of particular interest to the present invention and which is responsive to a control signal 22 having a second predetermined duration which is less than the first predetermined duration of the input signals 16. The controllable switch 20 is interposed between the analog-to-digital converter 12 and the power supply 14 and provides the application of excitation to the analog-to-digital converter 12 in response to the control signal 22 causing the analog-to-digital converter 12 to provide output signals which are in the form of digital units, such as binary bits, representative of the analog input (signals 16) to the analog-to-digital converter 12. The output signal of the analog-to-digital converter is generally represented in FIG. 1 as output signal 24 which, in one embodiment for testing purposes, is routed, via signal path 26, to a digital signal analyzer 28.

The analog-to-digital converter 12 may be an 8 bit device having a bandwidth of 750 mega-hertz (Mhz) and made available from SPT, Inc., as their Model SPT7755. The analog-to-digital converter 12 without the benefits of the present invention would have a typical power consumption of 6 watts of energy and run at a temperature of approximately 700° C.; however, as will be further described, the analog-to-digital converter 12 operated in accordance with the present invention has a nominal power consumption of 5.5 milliwatts and is operated at ambient room temperature.

The controllable switch 20 is preferably a Metal Oxide Semiconductor Field Effect Transistor (MOSFET) typically used as high speed analog switches, but any electronically controllable switch may be used in the practice of the present invention.

In general, the practice of the present invention employs power switching of the analog-to-digital converter 12 so as to conserve power and reduce heat generation thereof. As used herein, power switching is meant to represent the operation of turning off the analog-to-digital converter during the inter-pulse period and turning the analog-to-digital converter back on in time for the next pulse. The inter-pulse period being the time duration between the pulses of the pulse train forming the input signals 16. More particularly, assume the analog-to-digital converter 12 is used in a system that receives input signals 16 that are in the form of pulses separated by a first predetermined duration, such as 1000 μs. For such a selection, the control signal 22 would be also selected to provide for a series of pulses separated from each other by a second predetermined duration which is less than the first predetermined duration and has a typical value of 1 μs. For these first (1000) and second (1) predetermined durations, the analog-to-digital converter would be operated in a non-continuous manner such that it would be activated for 1 μs out of a 1000 μs so as to provide for a duty cycle of 1000. This duty cycle would render the reduction of power consumption and heat load by a factor of 1000 as compared to the conventional analog-to-digital converter having the typical power consumption of 6 watts of energy and the typical operating temperature of 70° C. The analog-to-digital converter 12 of the present invention would have a power consumption of 5.5 milliwatts and operate at ambient room temperature instead of 70° C. temperature resulting without the benefits of the present invention.

For these selected first and second predetermined durations of 1000 μs and 1 μs, the control signal 22 would be selected so that it occurs 200 nanoseconds before the occurrence of the input signal 16 so that the analog-to-digital converter 12 is allowed sufficient time to properly stabilize and start functioning properly.

In the practice of the present invention, testing was performed using the circuit arrangement 10 of FIG. 1 wherein the output signal 24 was routed to a Tektronix Digital Signal Analyzer 602A. The control signal 22 was in the form of pulses generated by a Hewlett-Packard (HP Model 8082A) pulse generator. The clock signal 18 and the input signal 16 were generated by Hewlett-Packard signal sources models HP 8662A and HP 4195A respectively. The representative wave forms of input signal 16 and output signal 24 are illustrated by the plot 38 of FIG. 2.

Figure 2:
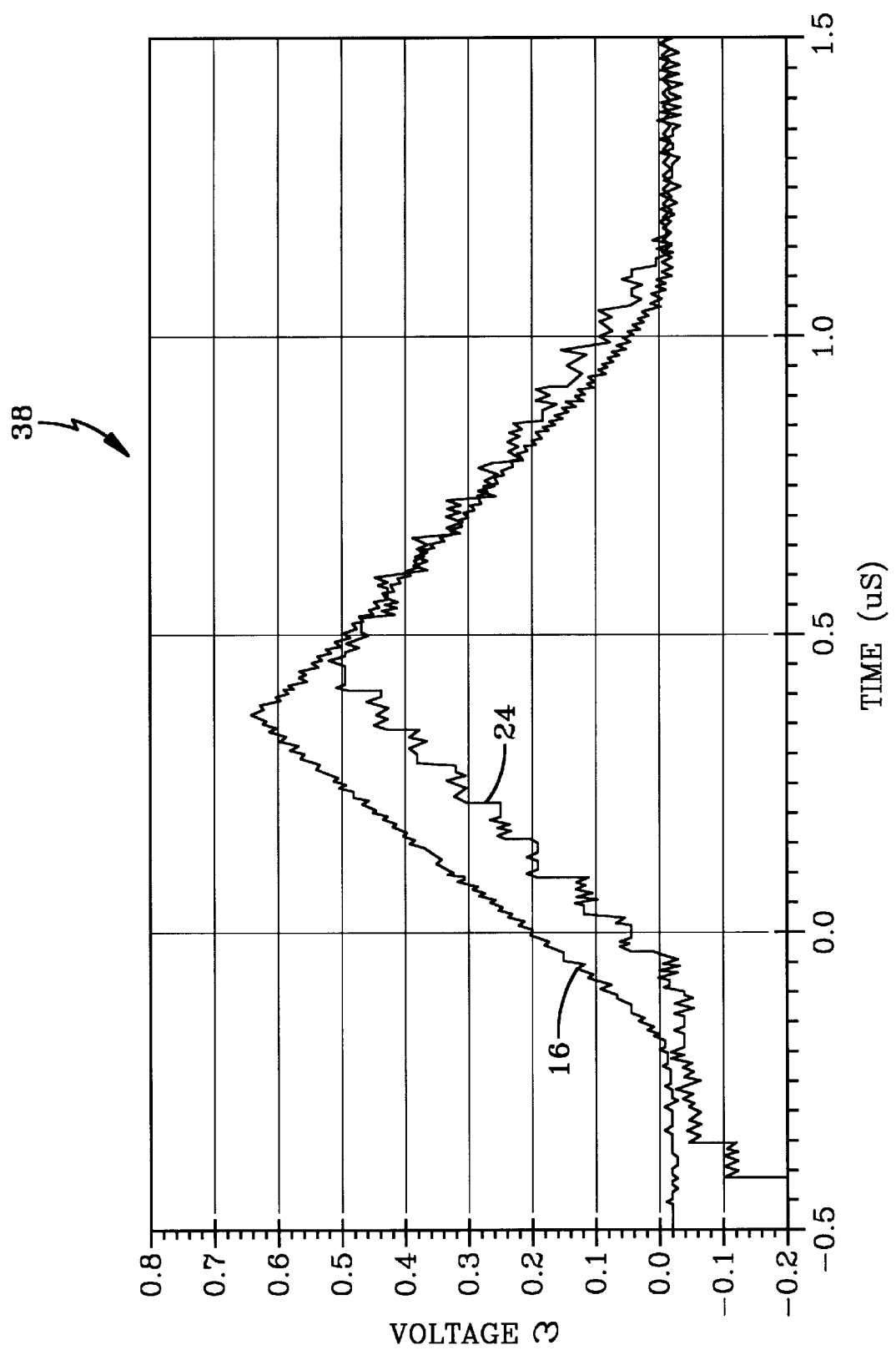
FIG. 2 is a plot illustrating the results achieved by the practice of the present invention.

FIG. 2 has an X axis indicated in time, given in microseconds, and a Y axis indicated in voltage and given in terms of volts. The input signal 16 was selected to have a triangle waveform and the output signal 24 was produced by the SPT7755 analog-to-digital converter 12 used in the performed testing. The staircase effect of the output signal 24 of FIG. 2 is an artifact of the decimated digital to analog converter output on board the SPT7755 test board that was used to observe the output. An un-decimated digital stream output signal 24 contemplated by the practice of the present invention does not exhibit this staircase effect.

The analog-to-digital converter 12 was tested with clocked input frequencies of 250, 500, 700 and 1000 mega-hertz (Mhz). The signal 24 of FIG. 2 is representative of the corresponding response with the 1000 mega-hertz clock frequency input and a signal pulse repetition rate of 1 kHz.

As seen in FIG. 2, the output 24 is an accurate reproduction of the input triangle signal 16 and has no distortion introduced by the switching process related to the present invention, that is, the turn-on and turn-off of the controllable switch 20 of FIG. 1. For the results obtained in FIG. 2, the control signal 22 was selected to precede the input signal 16 by 200 nanoseconds so that the power supply 14 is switched by the controllable switch 20 and applied to the analog-to-digital converter 12, 200 nanoseconds before the arrival of an input signal 16.

The results of FIG. 2 illustrates the advantages of the present invention for drastically reducing the power consumption and the heat generation of the conventional analog-to-digital converters 12 not having the benefits of the present invention. In the operation of the present invention, wherein the analog-to-digital converter 12 is operated in a non-continuous manner, such that the second predetermined duration is 1 μs and the first predetermined duration is 1000 Ms, resulting in a duty cycle of 1000 caused the power consumption and heat load to be reduced by a factor of 1000, as compared to conventional analog-to-digital converters 12 not having the benefits of the present invention.

It should now be appreciated that the practice of the present invention provides for a system for reducing the power consumption and heat generation of a data gathering circuit, such as an analog-to-digital converter, while at the same time allowing for the analog-to-digital converter to properly respond to input signals in the system in which the analog-to-digital converter is employed.

Although certain features of the invention have been illustrated and described herein, better modifications and changes will occur to those skilled in the art. It is, therefore, to be understood that the appended claims are intended to cover all such modifications and changes that fall within the spirit of the invention.

What I claim is:

1. A system having a circuit used for gathering data in a non-continuous manner and operable upon application of excitation from a power supply, said circuit being responsive to the simultaneous occurrence of input signals representative of said data and a clock signal, said input signals being in the form of pulses separated by a first predetermined duration, said gathering data system comprising:

a controllable switch responsive to a control signal having a second predetermined duration which is less than said first predetermined duration, said controllable switch being interposed between said circuit and said power supply and providing said application of said excitation to said circuit in response to said control signal causing said circuit to provide output signals therefrom.

2. The system according to claim 1, wherein said circuit is an analog-to-digital converter.

3. The system according to claim 2, wherein said analog-to-digital converter is an 8 bit device with a response up to about 750 mega-hertz (Mhz).

4. The system according to claim 3, wherein said first predetermined duration is about 1000 micro-seconds (μs) and said second predetermined duration is about 1 microsecond (μs) so that a duty cycle of said analog-to-digital converter is about 1000.

5. The system according to claim 4, wherein said predetermined duration establishes a non-continuous operation which reduces power consumption and heat load of said analog-to-digital converter by a factor equal to the duty cycle as compared to a continuous operation of said analog-to-digital converter.

6. The system according to claim 1, wherein said controllable switch is a Metal Oxide Semiconductor Field Effect Transistor (MOSFET).

7. The system according to claim 1, wherein said clock signal has a frequency from about 250 mega-hertz (Mhz) to about 1000 mega-hertz (Mhz).

\* \* \* \* \*